United States Patent [19]

Hildel et al.

[11] Patent Number: 4,534,668
[45] Date of Patent: Aug. 13, 1985

[54] PHOTOELECTRIC KEYBOARD

[75] Inventors: Heinz Hildel, Nuremberg; Wolfgang Schnell, Furth; Gerald Westphal, Nuremberg, all of Fed. Rep. of Germany

[73] Assignee: Triumph-Adler Aktiengesellschaft fur Buro- and Informationstechnik, Nuremberg, Fed. Rep. of Germany

[21] Appl. No.: 613,270

[22] Filed: May 24, 1984

[30] Foreign Application Priority Data

Jul. 2, 1983 [DE] Fed. Rep. of Germany ....... 3323989

[51] Int. Cl.³ ............................................. B41J 5/08
[52] U.S. Cl. .................................. 400/477; 340/365 P
[58] Field of Search ....................... 400/477, 478, 479; 340/365 P; 178/17 D

[56] References Cited

U.S. PATENT DOCUMENTS 3,372,789  3/1968  Thiele et al. ................... 400/479
3,603,982  9/1971  Patti ............................. 340/365 P
3,676,689  7/1972  Knepper, Sr. ............. 340/365 P X
3,856,127 12/1974  Halfon et al. ................. 400/479

FOREIGN PATENT DOCUMENTS 1561211  2/1973  Fed. Rep. of Germany .

OTHER PUBLICATIONS

IBM Technical Disclosure Bulletin, vol. 15, No. 11, Apr. 1973, pp. 3348–3349, "Miniature Optical Keyboard", by Ludeman.

Primary Examiner—Edgar S. Burr
Assistant Examiner—Charles A. Pearson
Attorney, Agent, or Firm—Joseph R. Spalla

[57] ABSTRACT

A photoelectric keyboard for typewriters and similar machines comprises two parallel plate modules spaced one above the other, the upper plate module comprising a plate of transparent material having holes supporting and guiding light transparent depressible key stems, and having cutouts supporting light sources, and the lower plate module comprising a printed circuit board supporting photo elements opposite the ends of key stems. The ends of the transparent key stems are, in normal position, spaced a predetermined optical distance from the photo elements arranged on the lower plate such that the light radiated from the ends of the key stems is insufficient to activate associated photo elements. On depressing a key, the distance between the end of the key stem and an associated photo element is reduced and the light beam radiated from the end of the key stem is sufficient to activate the associated photo element. Thus only the corresponding photo element is activated by a depressed key.

5 Claims, 4 Drawing Figures

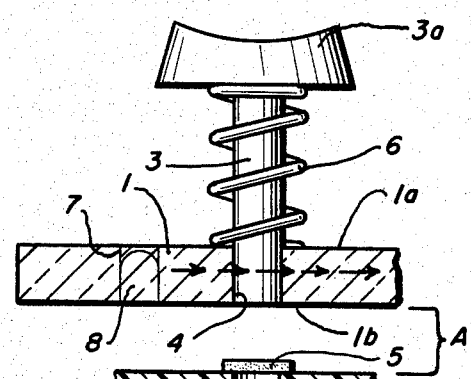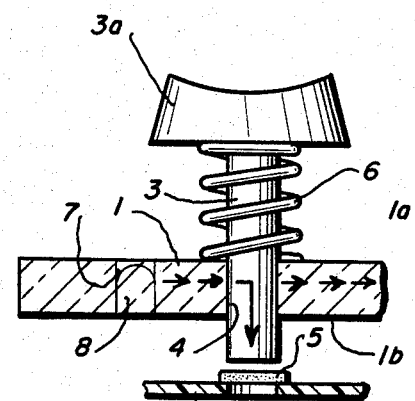
Fig._1  Fig._2
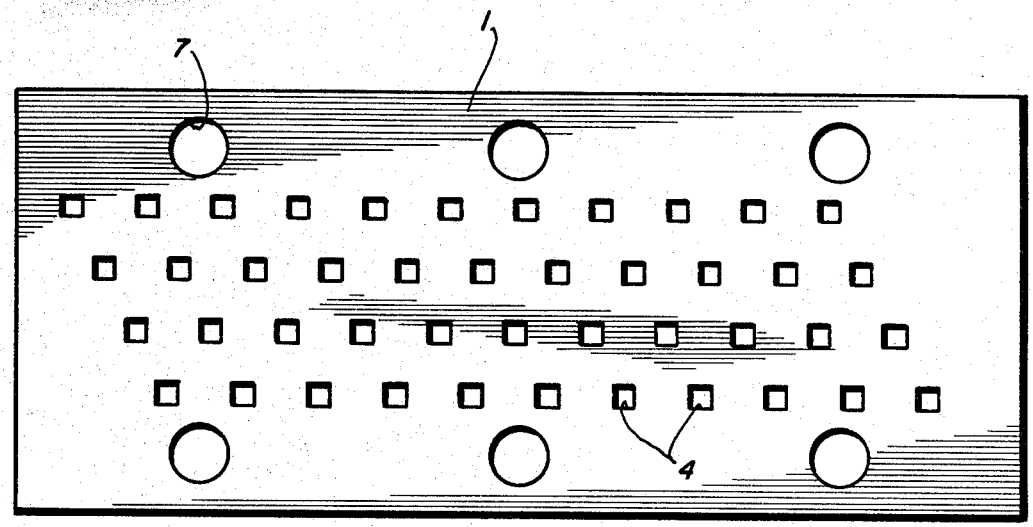
Fig._3
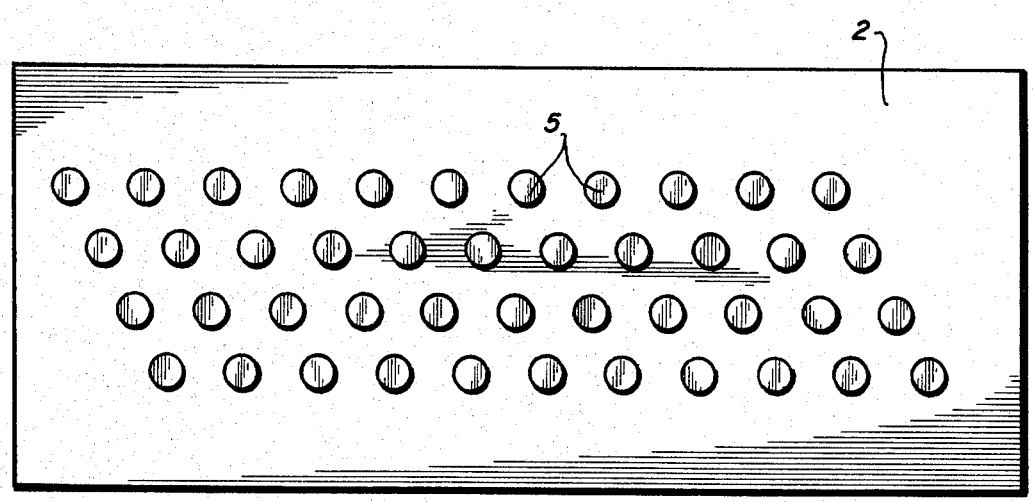
Fig._4

PHOTOELECTRIC KEYBOARD

The invention relates to a photoelectric keyboard for typewriters and similar machines; more particularly it relates to photoelectric keyboard having two plates spaced one above the other; the upper plate comprising openings for guiding key stems and cutouts supporting light sources for illuminating the upper plate and the lower plate comprising a printed circuit board having photo elements corresponding to keys and responsive to light emitted from depressed key stems.

Photoelectric keyboards are known from DE-PS 15 61 211, where for the input of symbols, such as characters or numbers, generally each key has assigned to it masks in the form, for example, of a slide or a coding template, which, as a key is being depressed, is moved into the path of light tracks extending between a light source and photo-elements, e.g. photo diodes, photo transistors, etc., whereby a coded signal correlated with this key is triggered.

Another known photoelectric keyboard disclosed in U.S. Pat. No. 3,856,127 comprises a matrix with light-carrying channels or grooves crossing in different planes, with a light source at one end and a photo-element at the other end. At each point of intersection of the channels a key-operable masking device, e.g. in the form of a slide or a template, is provided. By interruption of the passing light beam, the photo-element is de-energized and the signal is transmitted to the equipment to be operated by the keys.

With these known keyboards it cannot be prevented reliably that the light beams will overlap or will spread so that several of the photo elements receive light. Hence there is danger of the equipment malfunctioning.

The disadvantages of the prior art are overcome in accordance with the invention in the provision of a first illuminated transparent plate for supporting light transparent key stems, the ends of which in undepressed state are spaced from photo sensitive elements carried on a parallel plate such that light in the key stems is insufficient to activate a corresponding photo element, while in the depressed state the end of a key stem is brought close to its associated photo element and light in the key stem is sufficient to activate the photo element.

An object of the invention is to provide a photoelectric keyboard which is constructed of simple and inexpensive parts.

Another object of the invention is to provide a reliable low noise photoelectric keyboard which delivers discrete output signals corresponding only to depressed keys.

Other objects, features and advantages of the present invention will become better known to those skilled in the art from a reading of the following detailed description when taken in conjunction with the accompanying drawing wherein like reference numerals designate like or corresponding elements throughout the several views thereof and wherein:

FIG. 1 is a partial elevational view with parts in section showing a key of a keyboard in undepressed state;

FIG. 2 is an elevational view similar to FIG. 1 showing a key depressed to generate an output signal;

FIG. 3 is a plan view of the upper plate comprising the keyboard of FIG. 1; and

FIG. 4 is a plan view of the lower plate comprising the keyboard of FIG. 1.

Referring now to the drawing wherein like reference numerals designate like or corresponding parts throughout the several views there is shown in FIG. 1 a photoelectric keyboard in accordance with the invention comprising an upper plate 1 and a parallel lower plate 2, these two plates being spaced a predetermined distance from each other in vertical direction. The upper plate 1 consists of a transparent material, e.g. acrylic glass, and has holes 4 arranged in keyboard coordinates which receive and guide key stems 3 having key tops 3a. In addition to the guide holes 4, the upper plate 1 is provided with further bores or cutouts 7 wherein lamps 8 are supported for illuminating the upper plate 1. To prevent undesired passage of light into or out of the environment, the upper and lower surface 1a, 1b of the upper plate 1 are frosted or made opaque in some other known way.

The lower plate 2 is designed as a printed circuit board with contact paths to photo elements 5 carried on the printed circuit board, e.g. photo diodes, photo transistors or the like, which too are arranged in keyboard coordinates relative to the corresponding guide holes 4 of the upper plate 1.

To expand the possible uses of the photoelectric keyboard of the invention, the upper plate 1 may be formed as a module containing the respective keys. The lower plate 2 carrying the photo elements 5 may also be formed as a module for use with a matching upper plate module.

The key stems 3, slidably supported in guide holes 4 of the upper plate 1, are, like plate 1 itself, made of a transparent material and are held in their inoperative position by an ordinary return spring 6 located between the upper plate 1 and key tops 3a. In the inoperative normal position, the lower ends of the key stems 3 are spaced from the correlated photo elements 5 by an optical safety distance A, i.e. a distance for which the light radiation out of the end of the key stem 3 facing the photo elements 5 is so weak that it is insufficient to activate the photo elements 5. As a rule, in the inoperative position the end of the key stem 3 extends only to the lower surface of the upper plate as shown in FIG. 1. Hence the distance of plates 1 and 2 from each other must be selected so that the proper optical distance A is always assured.

The transparent key stems 3 may have various cross-sectional forms; they may be round, in which case for example a slot should be provided to prevent rotation inside the guide hole 4, or they may have a square or rectangular cross section for accommodation in square guide holes 4 as shown in FIG. 3. The key stems 3 may also be shaped to intensify the light radiated from the ends thereof.

When a key top 3a is depressed counter to the force of the return spring 6 as shown in FIG. 2, the end of the respective key stem 3 is brought close to its corresponding photo element 5. The reduction of the optical distance between the end of a depressed key stem and an associated photo element 5 is so shortened that light radiated from the end of the depressed key stem 3 is sufficient to activate or energize the associated photo element 5.

As is evident from the above description the light in the illuminated upper plate 1 enters individual key stems 3 and the individual ray paths exist only between the ends of depressed key stems 3 and the photo elements 5 and not directly between light transmitter and light receiver as in the prior art. Due to the permanent full illumination of the upper plate 1 it is ensured that only light radiated from the end of a depressed key stem 3 is sufficient to activate the respective photo element 5, so that disturbances, for example due to the fact that several of the photo elements 5 receive light, as may be in the case with keyboards with individual light paths, are avoided.

The invention claimed is:

1. A photoelectric keyboard for typewriters and similar machines comprising
   a first light transparent plate having holes extending from the upper to the lower surfaces thereof,
   a light source mounted in at least one of said holes in said first transparent plate for internally illuminating said first transparent plate,
   keys having light transparent key stems mounted in others of said holes for movement between normal and depressed positions, said key stems remaining in said holes both in said normal and said depressed positions, light in said illuminated first transparent plate continuously illuminating said transparent key stems and radiating from the lower ends of said transparent key stems,
   a second plate parallel to and spaced from said first transparent plate comprising a printed circuit board, and
   photo elements mounted on said printed circuit board opposite and spaced from the radiating ends of said transparent key stems by a predetermined distance established by the spacing between said first and second plates,
   said predetermined distance being such that light radiated from the lower ends of said transparent key stems is sufficient to activate a corresponding photo element only when the radiating ends are moved close to said photoelements in response to movement of a key from normal to depressed position.

2. Photoelectric keyboard as recited in claim 1, the assembly of said first plate and said mounted light source and said keys comprising a first module.

3. Photoelectric keyboard as recited in claim 2, the assembly of said second plate and said mounted photo elements comprising a module matched to said first module.

4. Photoelectric keyboard as recited in claim 1, said upper and lower surfaces of said first plate being opaque to prevent undesired admission to or issuance of light therein.

5. Photoelectric keyboard as recited in claim 1, said lower ends of said key stems being flat and coplanar with said lower surface of said first transparent plate when in normal position.

* * * * *